(12) United States Patent
Hsu et al.

(10) Patent No.: US 11,134,564 B1
(45) Date of Patent: Sep. 28, 2021

(54) TRANSPARENT PCB AND METHOD FOR MANUFACTURING THE SAME

(71) Applicants: Avary Holding (Shenzhen) Co., Limited., Shenzhen (CN); QING DING PRECISION ELECTRONICS (HUAIAN) CO.,LTD, Huai an (CN)

(72) Inventors: Hsiao-Ting Hsu, New Taipei (TW); Ming-Jaan Ho, New Taipei (TW); Fu-Yun Shen, Shenzhen (CN); Li-Kun Liu, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 0 days.

(21) Appl. No.: 17/036,544

(22) Filed: Sep. 29, 2020

(30) Foreign Application Priority Data

Apr. 23, 2020 (CN) .......................... 202010327373.5

(51) Int. Cl.
| | |
|---|---|
| *H01K 1/02* | (2006.01) |
| *H05K 1/02* | (2006.01) |
| *H05K 1/09* | (2006.01) |
| *H05K 1/11* | (2006.01) |
| *H05K 3/46* | (2006.01) |
| *H05K 3/06* | (2006.01) |
| *H05K 1/18* | (2006.01) |
| *H05K 3/40* | (2006.01) |

(Continued)

(52) U.S. Cl.
CPC ............. *H05K 1/0274* (2013.01); *H05K 1/09* (2013.01); *H05K 1/111* (2013.01); *H05K 1/181* (2013.01); *H05K 3/06* (2013.01); *H05K 3/28* (2013.01); *H05K 3/32* (2013.01); *H05K 3/4007* (2013.01); *H05K 3/4644* (2013.01); *H05K 2201/0108* (2013.01); *H05K 2203/0502* (2013.01)

(58) Field of Classification Search
USPC ........................................................ 174/257
See application file for complete search history.

(56) References Cited

U.S. PATENT DOCUMENTS

| | | | | |
|---|---|---|---|---|
| 10,865,470 | B2 * | 12/2020 | Yamazaki | ............... C30B 23/02 |
| 2009/0117730 | A1 * | 5/2009 | Maitani | ................... H01L 24/11 |
| | | | | 438/613 |

(Continued)

FOREIGN PATENT DOCUMENTS

| | | |
|---|---|---|
| TW | 583688 | 4/2004 |
| TW | I462659 B | 11/2014 |

*Primary Examiner* — Stanley Tso
(74) *Attorney, Agent, or Firm* — ScienBiziP, P.C.

(57) ABSTRACT

A transparent PCB includes a transparent base film, a hardened layer, an electrode film, a first conductive paste, a second conductive paste, and an electronic component. The hardened layer is formed on a side of the transparent base film. The electrode film is formed on a side of the hardened layer. The electrode film includes a first transparent conductive oxide layer, a metal layer, and a second transparent conductive oxide layer. The first conductive paste is formed on the electrode film. The second conductive paste is formed on the electrode film and spaced from the first conductive paste. The electronic component is electrically connected to the electrode film through the first conductive paste and the second conductive paste. The present invention also needs to provide a method for manufacturing the transparent PCB.

10 Claims, 6 Drawing Sheets

(51) Int. Cl.
  *H05K 3/28*  (2006.01)
  *H05K 3/32*  (2006.01)

(56) References Cited

U.S. PATENT DOCUMENTS

| | | | | |
|---|---|---|---|---|
| 2010/0029044 | A1* | 2/2010 | Yagi | H01L 24/16 |
| | | | | 438/113 |
| 2011/0062485 | A1* | 3/2011 | Nakayama | H01L 33/42 |
| | | | | 257/99 |
| 2015/0050778 | A1* | 2/2015 | Asahi | H01L 24/83 |
| | | | | 438/108 |
| 2016/0282978 | A1* | 9/2016 | Wang | B32B 7/12 |
| 2016/0313769 | A1* | 10/2016 | Yoshitani | G06F 1/1675 |
| 2019/0051936 | A1* | 2/2019 | Meshcheryakov | H01G 11/06 |
| 2019/0165037 | A1* | 5/2019 | Chae | H01L 33/10 |
| 2019/0165038 | A1* | 5/2019 | Chae | H01L 33/30 |
| 2019/0258164 | A1* | 8/2019 | Tanigaki | G03F 7/322 |
| 2020/0066690 | A1* | 2/2020 | Chae | H01L 33/38 |
| 2020/0083254 | A1* | 3/2020 | Xu | H01L 27/1248 |
| 2020/0201470 | A1* | 6/2020 | Oh | H01Q 9/0407 |

* cited by examiner

TRANSPARENT PCB AND METHOD FOR MANUFACTURING THE SAME

FIELD

The subject matter herein generally relates to PCB (Printed Circuit Board), especially to a transparent PCB and a method for manufacturing the same.

BACKGROUND

Transparent circuit boards, a hot topic in the industry, have been used in mobile phones, automotive transparent boards, and other electronic products. However, when electronic components are mounted on a transparent circuit substrate by soldering, the electronic components and the transparent circuit substrate may be easily to be damaged by a temperature of the soldering.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
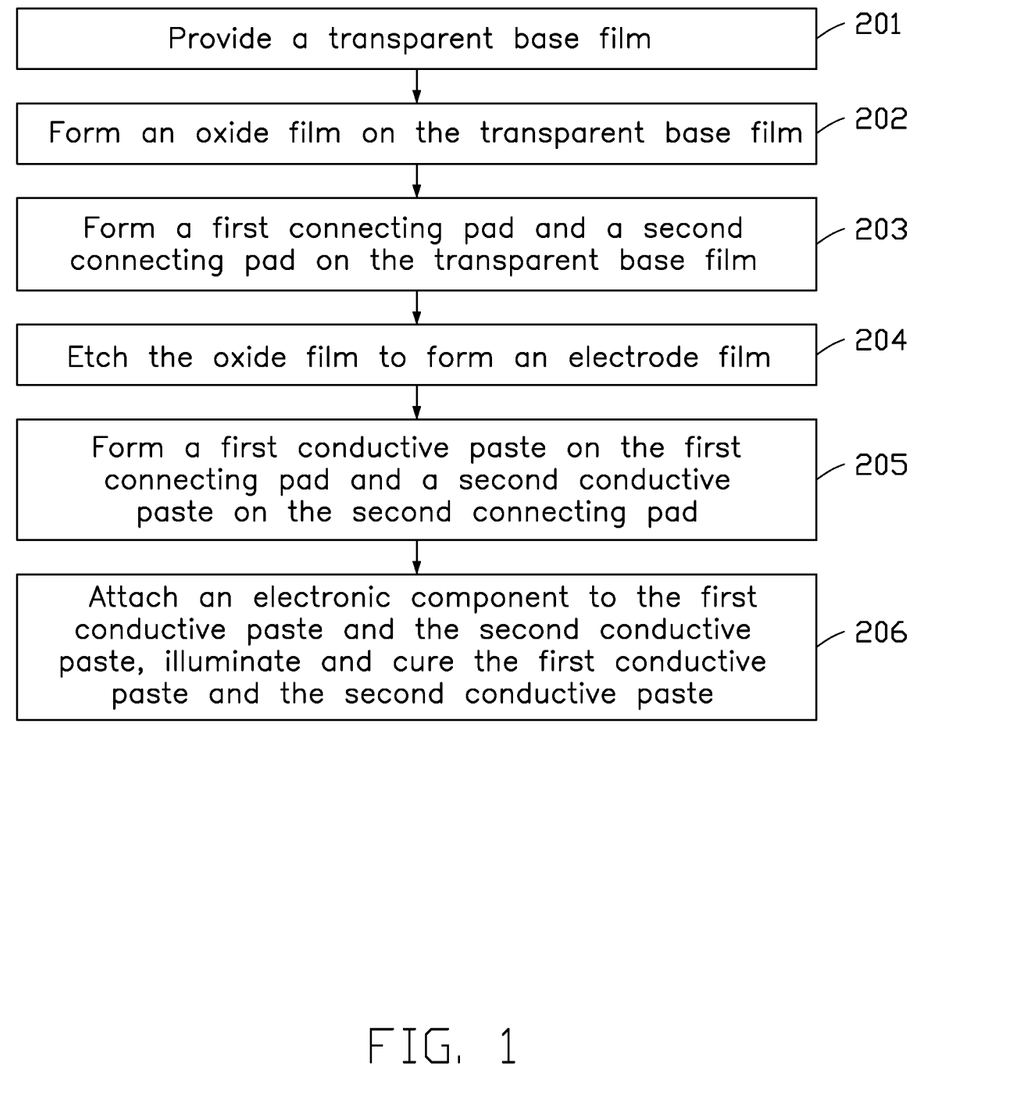
FIG. 1 is a flowchart of an embodiment of a method for manufacturing a transparent circuit board.

FIG. 1 illustrates a flowchart of a method in accordance with a first embodiment. The method for manufacturing a transparent PCB 100 (shown in FIG. 9) is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 201.

Figure 2:
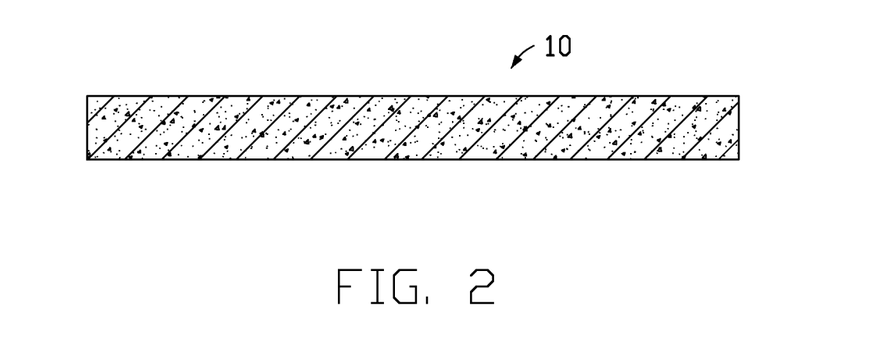
FIG. 2 is a cross-sectional view of an embodiment of a transparent base film.

At block 201, referring to FIG. 2, a transparent base film 10 is provided.

In at least one embodiment, a light transmittance of the transparent base film 10 is in a range of 88% to 95%.

The transparent base film 10 may be made of a material selected from polyethylene terephthalate (PET), polyethylene naphthalate (PEN), polyimide (PI), polymethyl methacrylate (PMMA), polystyrene (PS), cycio olefins polymer (COP), cycloolefin copolymer (COC), and any combination thereof.

In at least one embodiment, the transparent base film 10 may be made of glass.

A thickness of the transparent base film 10 may be varied as needed. In at least one embodiment, the thickness of the transparent base film 10 may be in a range of 15 μm to 200 μm.

Figure 3:
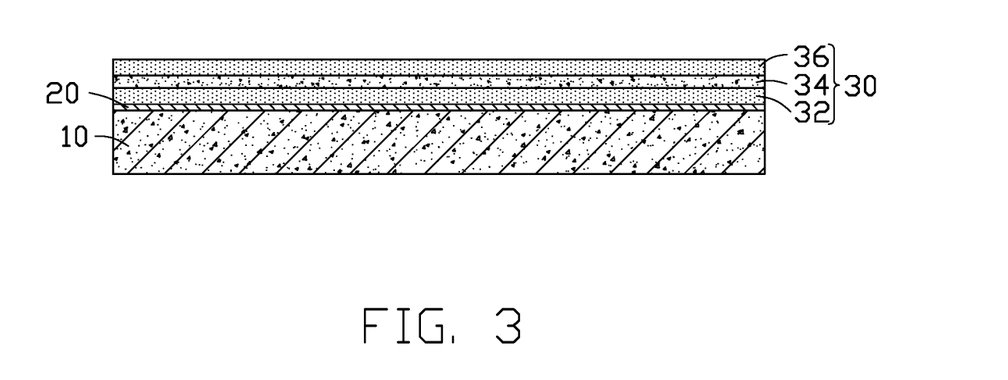
FIG. 3 is a cross-sectional view showing an oxide film and a hardened layer on the transparent base film of FIG. 2.

At block 202, referring to FIG. 3, an oxide film 30 is formed on a side of the transparent base film 10. Alight transmittance of the oxide film 30 is in a range of 82% to 95%.

In at least one embodiment, the oxide film 30 includes a first transparent conductive oxide layer 32, a metal layer 34, and a second transparent conductive oxide layer 36 stacking orderly. The metal layer 34 is sandwiched between the first transparent conductive oxide layer 32 and the second transparent conductive oxide layer 36.

The first transparent conductive oxide layer 32 and the second transparent conductive oxide layer 36 include transparent conductive oxide, respectively. The transparent conductive oxide may be made of a material selected zinc oxide (ZnO), indium tin oxide (ITO), indium zinc oxide (IZO), and any combination thereof. In at least one embodiment, the first transparent conductive oxide layer 32 and the second transparent conductive oxide layer 36 are made of zinc oxide. Zinc oxide may be made by zinc peroxide ($ZnO_2$).

The metal layer 34 may be made of a material selected vanadium, titanium, nickel, molybdenum, silver, and any combination thereof. In at least one embodiment, the metal layer 34 is made of vanadium.

In at least one embodiment, a sheet resistance of the oxide film 30 may be in a range of 10 $\Omega/m^2$ to 200 $\Omega/m^2$.

In at least one embodiment, a thickness of the oxide film 30 may be in a range of 200 nm to 250 nm.

In at least one embodiment, the oxide film 30 may include a plurality of transparent conductive oxide layers. A metal layer arranged between any two adjacent transparent conductive oxide layers. For example, the oxide film 30 may further include a third transparent conductive oxide layer (not shown) formed on a side of the second transparent conductive oxide layer 36 facing away from the first transparent conductive oxide layer 32, and a metal layer (not shown) sandwiched between the third transparent conductive oxide layer and the second transparent conductive oxide layer 36.

Figure 4:
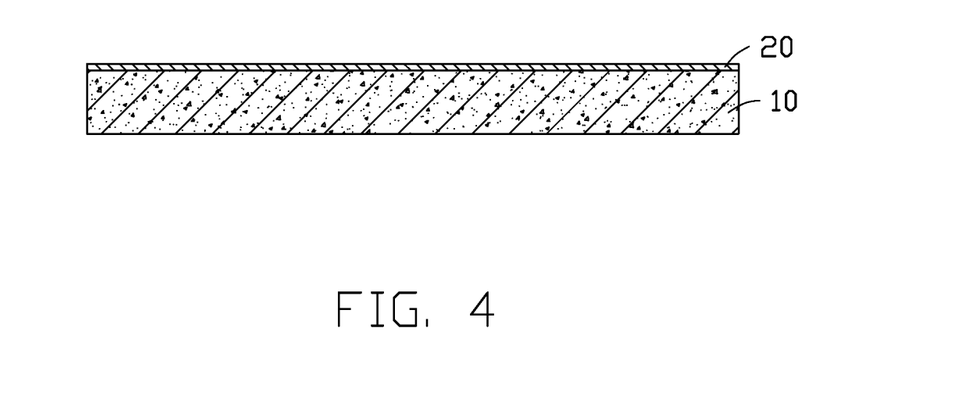
FIG. 4 is a cross-sectional view showing a hardened layer on the transparent base film of FIG. 2.

In at least one embodiment, referring to FIGS. 3 and 4, a hardened layer 20 is formed between the transparent base film 10 and the oxide film 30, thereby adjusting a thermal stress of the transparent PCB 100 (shown in FIG. 9) caused by a difference in coefficient of thermal expansion (CTE). The hardened layer 20 may be a silicon dioxide coating.

Figure 5:
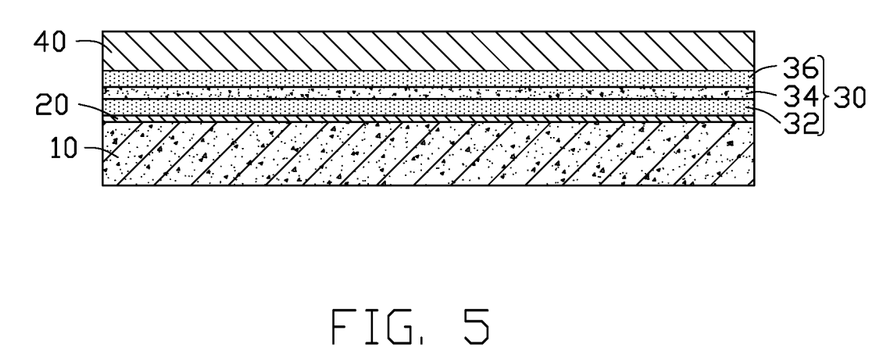
FIG. 5 is a cross-sectional view showing a copper layer on the oxide film of FIG. 3.
Figure 6:
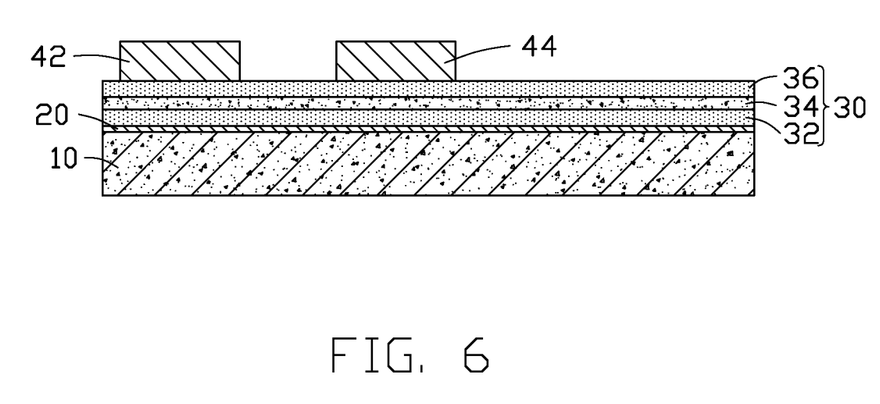
FIG. 6 is a cross-sectional view showing a first connecting pad and a second connecting pad on the oxide film of FIG. 3.

At block 203, referring to FIGS. 5 and 6, a first connecting pad 42 and a second connecting pad 44 spaced from each other are formed on a surface of the oxide film 30 facing away from the transparent base film 10.

In at least one embodiment, the first connecting pad 42 and the second connecting pad 44 are formed by forming a copper layer 40 on a surface of the oxide film 30 facing away from the transparent base film 10, and etching the copper layer 40.

The copper layer 40 may be formed by sputtering or electroplating.

A size of the first connecting pad 42 and a size of the second connecting pad 44 may be varied as needed. In at least one embodiment, a length of the first connecting pad 42 is 200 μm, a width of the first connecting pad 42 is 200 μm. A length of the second connecting pad 44 is 200 μm, a width of the second connecting pad 44 is 200 μm.

In at least one embodiment, a thickness of the first connecting pad 42 and a thickness of the second connecting pad 44 are in a range of 4 μm to 35 μm, respectively. Preferably, the thickness of the first connecting pad 42 and the thickness of the second connecting pad 44 are in a range of 9 μm to 18 μm, respectively.

Figure 7:
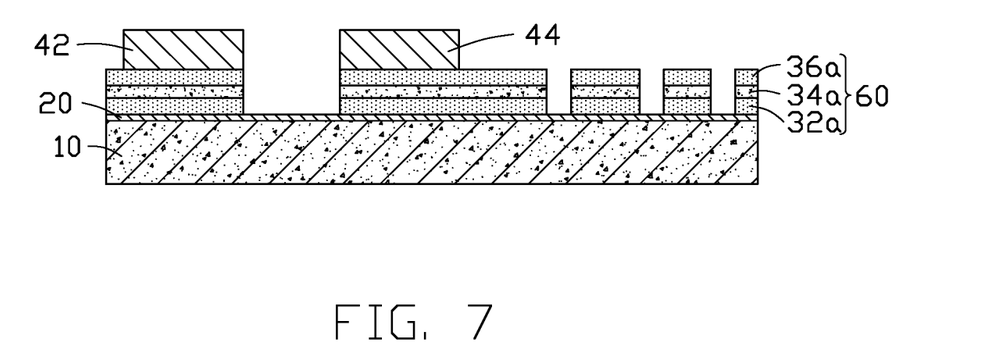
FIG. 7 is a cross-sectional view showing the oxide film of FIG. 6 etched.

At block 204, referring to FIG. 7, the oxide film 30 is etched to form an electrode film 60. The electrode film 60 includes an opening 61 corresponding to a gap between the first connecting pad 42 and the second connecting pad 44. The opening 61 penetrates the first transparent conductive oxide layer 32, the metal layer 34, and the second transparent conductive oxide layer 36. Each region of the oxide film 30 etched penetrates the first transparent conductive oxide layer 32, the metal layer 34, and the second transparent conductive oxide layer 36.

A light transmittance of the electrode film 60 is in a range of 82% to 95%. A sheet resistance of the electrode film 60 is in a range of $105\Omega/m^2$ to $200\Omega/m^2$.

Figure 8:
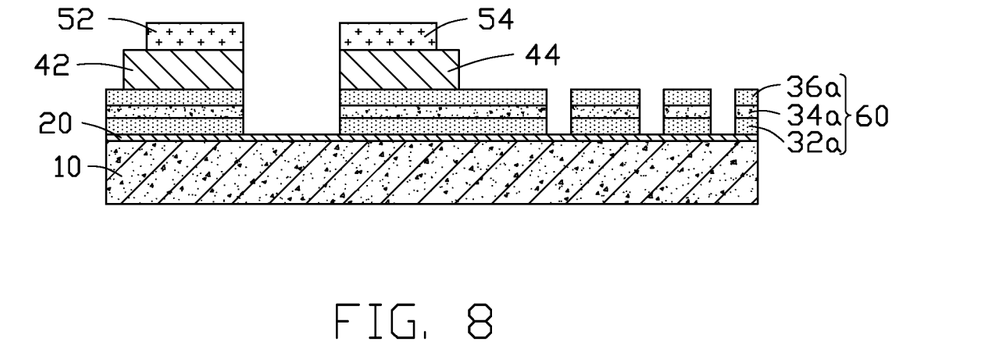
FIG. 8 is a cross-sectional view showing a first conductive paste on the first connecting pad of FIG. 7 and a second conductive paste on the second connecting pad of FIG. 7.

At block 205, referring to FIG. 8, a first conductive paste 52 is formed on a surface of the first connecting pad 42 facing away from the transparent base film 10, and a second conductive paste 54 is formed on a surface of the second connecting pad 44 facing away from the transparent base film 10.

In at least one embodiment, the first conductive paste 52 and the second conductive paste 54 are solder pastes.

Referring to FIG. 8, in at least one embodiment, a surface of the first connecting pad 42 facing the second connecting pad 44 is flush with a surface of the first conductive paste 52 facing the second conductive paste 54. A surface of the second connecting pad 44 facing the first connecting pad 42 is flush with a surface of the second conductive paste 54 facing the first conductive paste 52.

Figure 9:
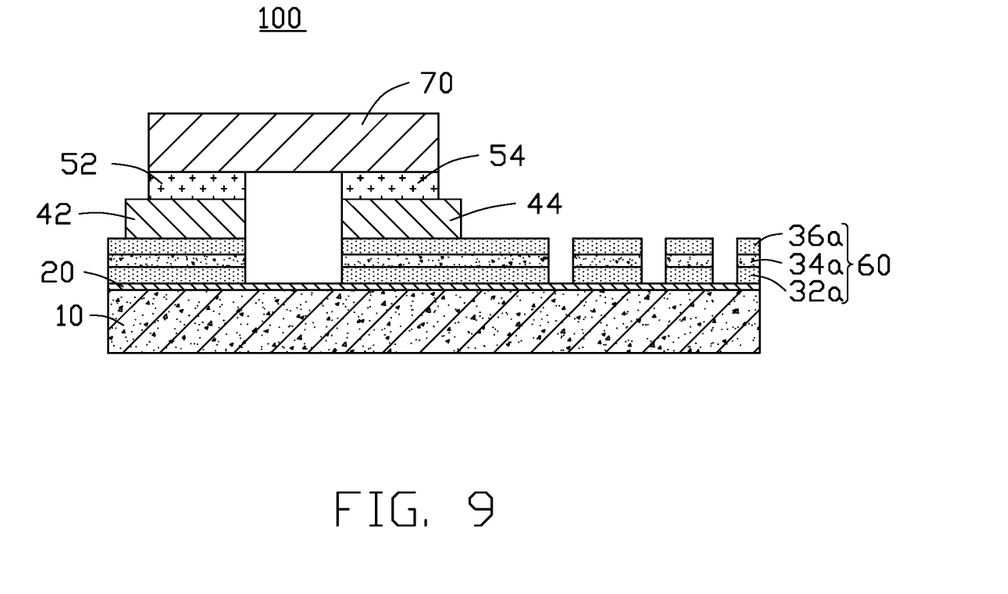
FIG. 9 is a cross-sectional view showing a first embodiment of a transparent base film.

At block 206, referring to FIG. 9, an electronic component 70 is attached to the first conductive paste 52 and the second conductive paste 54, and the first conductive paste 52 and the second conductive paste 54 are illuminated and cured to fix the electronic component 70 on the first conductive paste 52 and the second conductive paste 54, thereby obtaining the transparent PCB 100.

In at least one embodiment, the first conductive paste 52 and the second conductive paste 54 are melted by illuminating, and then cured, thereby fixing the electronic component 70 on the first conductive paste 52 and the second conductive paste 54. A light may be irradiated from a side of the transparent base film 10 facing away from the electrode film 60, or may be irradiated from a side of the electrode film 60 facing away from the transparent base film 10 to melt the first conductive paste 52 and the second conductive paste 54. So that a connection between the electronic component 70 and the electrode film 60 is realized at a low temperature, thereby preventing the transparent base film 10 and the electronic component 70 (such as sensor) which are temperature-sensitive from being damaged by high temperature.

Figure 10:
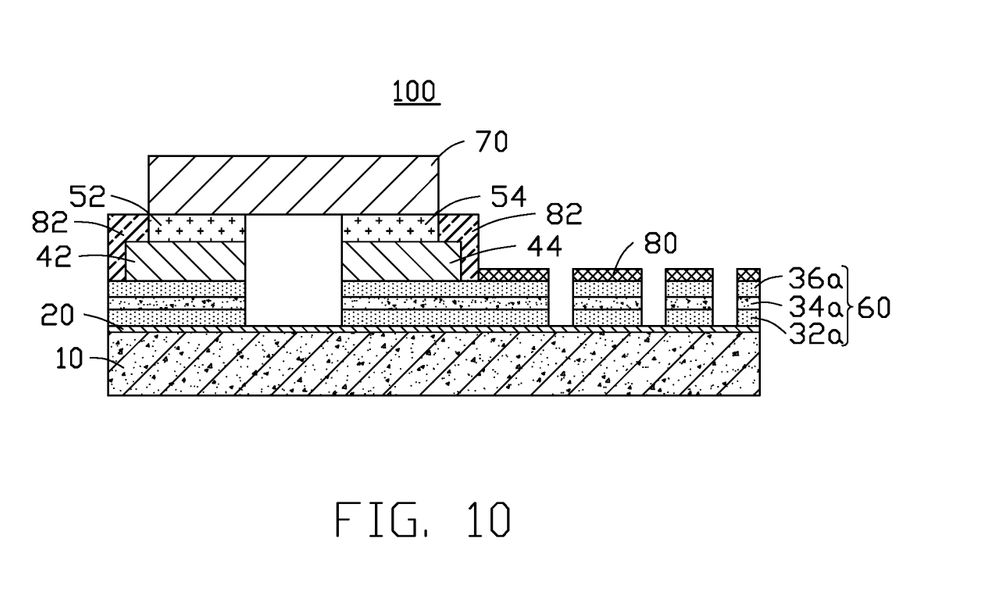
FIG. 10 is a cross-sectional view showing another embodiment of a transparent base film.

In at least one embodiment, referring to FIG. 10, the method may further include forming a protective layer 80 on a portion of a surface of the electrode film 60 facing the transparent base film 10 and exposed from the first connecting pad 42 and the second connecting pad 44. In at least one embodiment, a covering layer 82 may cover an exposed surface of the first connecting pad 42, an exposed surface of the second connecting pad 44, an exposed surface of the first conductive paste 52 and an exposed surface of the second conductive paste 54.

Figure 11:
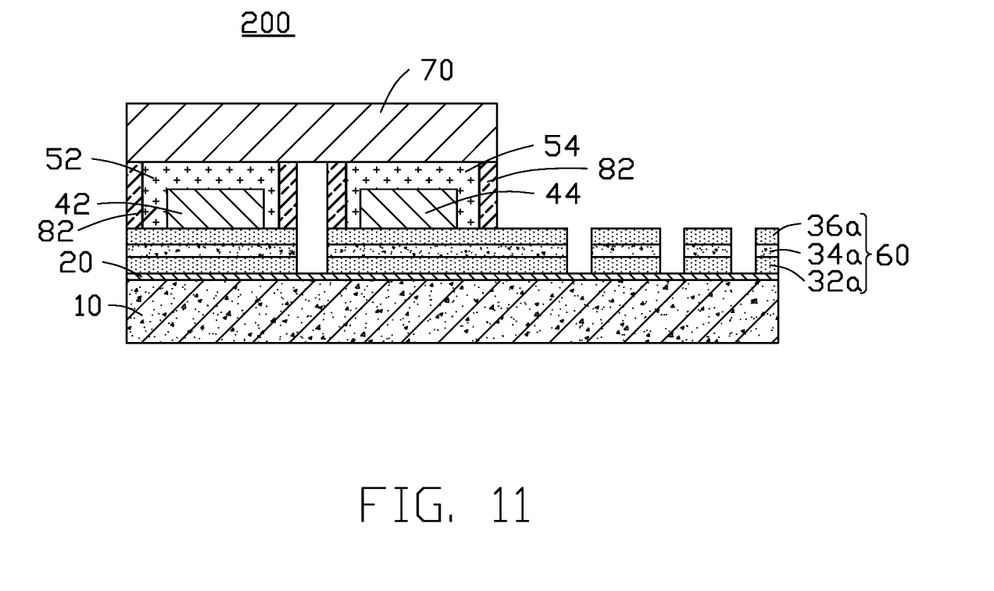
FIG. 11 is a cross-sectional view showing a second embodiment of a transparent base film.

In a second embodiment, referring to FIG. 11, the method for manufacturing a circuit board 200 differs from the first embodiment as described above, the first conductive paste 52 is further formed on side surfaces of the first connecting pad 42 connecting the surface of the first connecting pad 42 facing away from the transparent base film 10 and a surface of the first connecting pad 42 facing the transparent base film 10; the second conductive paste 54 is further formed on side surfaces of the first connecting pad 42 connecting the surface of the second connecting pad 44 facing away from the transparent base film 10 and a surface of the second connecting pad 44 facing the transparent base film 10. The first conductive paste 52 wraps the first connecting pad 42, the second conductive paste 54 wraps the second connecting pad 44, thereby increasing a contact area between the first connecting pad 42 and the first conductive paste 52 and a contact area between the second connecting pad 44 and the second conductive paste 54. So that a bonding force between the first connecting pad 42 and the first conductive paste 52 and a bonding force between the second connecting pad 44 and the second conductive paste 54 are increased. The covering layer 82 wraps around a surface of the first conductive paste 52 connecting a surface of the first conductive paste 52 facing away from the transparent base film 10 and a surface of the first conductive paste 52 facing the transparent base film 10, and wraps around a surface of the second conductive paste 54 connecting a surface of the second conductive paste 54 facing away from the transparent base film 10 and a surface of the second conductive paste 54 facing the transparent base film 10.

Figure 12:
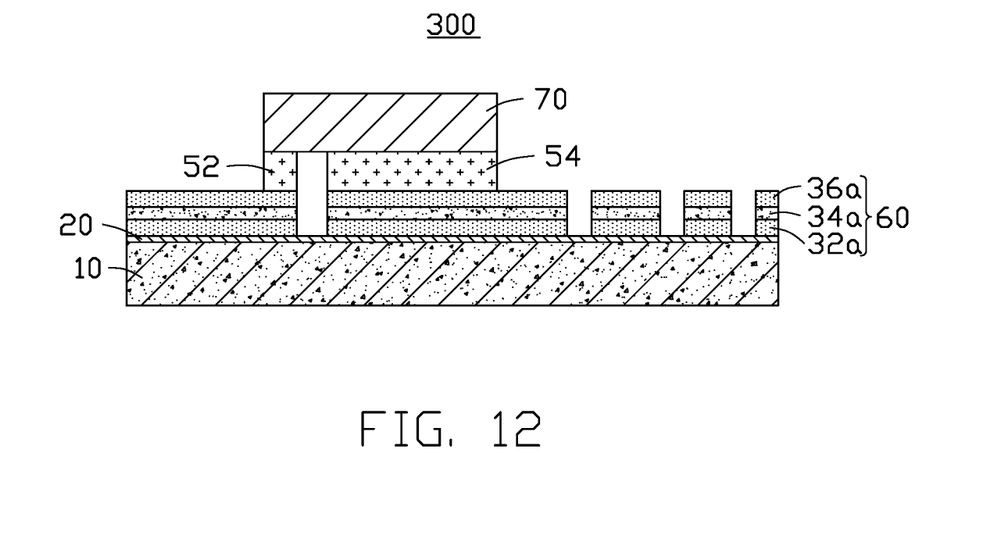
FIG. 12 is a cross-sectional view showing a third embodiment of a transparent base film.

In a third embodiment, referring to FIG. 12, the method for manufacturing a circuit board 300 differs from the first embodiment as described above, the first connecting pad 42 and the second connecting pad 44 can be omitted, the first conductive paste 52 and the second conductive paste 54 are directly formed on the side of the second transparent conductive oxide layer 36 facing away from the first transparent conductive oxide layer 32.

In at least one embodiment, the hardened layer 20 and the oxide film 30 may be formed by the following steps:

First, referring to FIG. 4, a surface hardening treatment is performed on a surface of the transparent base film 10 to form a hardened layer 20. The surface hardening treatment may be coating a primer layer to form the hardened layer 20.

Second, referring to FIG. 3, zinc oxide is sputtered on a surface of the hardened layer 20 facing away from the transparent base film 10 to form a first transparent conductive oxide layer 32.

Third, referring to FIG. 3, vanadium is sputtered on the first transparent conductive oxide layer 32 facing away from the hardened layer 20 to form a metal layer 34.

Fourth, referring to FIG. 3, zinc oxide is sputtered on a surface of the metal layer 34 facing away from the first transparent conductive oxide layer 32 to form a second transparent conductive oxide layer 36.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

FIG. 9 illustrates a first embodiment of a transparent PCB 100. The transparent PCB 100 includes a transparent base film 10, an electrode film 60 formed on a side of the transparent base film 10, and an electronic component 70 electrically connected to the electrode film 60.

In at least one embodiment, a light transmittance of the transparent base film 10 is in a range of 88% to 95%. The transparent base film 10 may be made of a material selected from polyethylene terephthalate (PET), polyethylene naphthalate (PEN), polyimide (PI), polymethyl methacrylate (PMMA), polystyrene (PS), cycio olefins polymer (COP), cycloolefin copolymer (COC), and any combination thereof. In at least one embodiment, the transparent base film 10 may be made of glass.

The electrode film 60 includes a first transparent conductive oxide layer 32, a metal layer 34, and a second transparent conductive oxide layer 36 that are stacked and patterned. The first transparent conductive oxide layer 32 is formed on the side of the transparent base film 10. The metal layer 34 is sandwiched between the second transparent conductive oxide layer 36 and a side of the first transparent conductive oxide layer 32 facing away from the transparent base film 10.

In at least one embodiment, a light transmittance of the electrode film 60 is in a range of 82% to 95%. A sheet resistance of the electrode film 60 is in a range of 10 $\Omega/m^2$ to 200 $\Omega/m^2$.

In at least one embodiment, the electrode film 60 may include a plurality of transparent conductive oxide layers. A metal layer arranged between any two adjacent transparent conductive oxide layers.

The transparent PCB 100 may further include a hardened layer 20 between the transparent base film 10 and the electrode film 60.

The transparent PCB 100 further include a first connecting pad 42, a second connecting pad 44, a first conductive paste 52, and a second conductive paste 54. The first connecting pad 42 and the second connecting pad 44 are formed on a surface of the electrode film 60 facing away from the transparent base film 10 and spaced from each other. The first conductive paste 52 is formed on a surface of the first connecting pad 42 facing away from the transparent base film 10, the second conductive paste 54 is formed on a surface of the second connecting pad 44 facing away from the transparent base film 10.

In at least one embodiment, a surface of the first connecting pad 42 facing the second connecting pad 44 is flush with a surface of the first conductive paste 52 facing the second conductive paste 54. A surface of the second connecting pad 44 facing the first connecting pad 42 is flush with a surface of the second conductive paste 54 facing the first conductive paste 52. The electronic component 70 is electrically connected to the electrode film 60 through the first connecting pad 42, the second connecting pad 44, the first conductive paste 52, and the second conductive paste 54.

Referring to FIG. 10, the transparent PCB 100 may further include a covering layer 82 covering an exposed surface of the first connecting pad 42, an exposed surface of the second connecting pad 44, an exposed surface of the first conductive paste 52 and an exposed surface of the second conductive paste 54.

The transparent PCB 100 may further include a protective layer 80 on a surface of the electrode film 60 facing the transparent base film 10 and exposed from the first connecting pad 42 and the second connecting pad 44.

In a second embodiment, referring to FIG. 11, a transparent circuit board 200 differs from the first embodiment as described above, the first conductive paste 52 is further formed on side surfaces of the first connecting pad 42 connecting the surface of the first connecting pad 42 facing away from the transparent base film 10 and a surface of the first connecting pad 42 facing the transparent base film 10; the second conductive paste 54 is further formed on side surfaces of the first connecting pad 42 connecting the surface of the second connecting pad 44 facing away from the transparent base film 10 and a surface of the second connecting pad 44 facing the transparent base film 10. So that the first connecting pad 42 is embedded in the first conductive paste 52, the second connecting pad 44 is embedded in the second conductive paste 54.

The covering layer 82 wraps around a surface of the first conductive paste 52 connecting a surface of the first conductive paste 52 facing away from the transparent base film 10 and a surface of the first conductive paste 52 facing the transparent base film 10, and wraps around a surface of the second conductive paste 54 connecting a surface of the second conductive paste 54 facing away from the transparent base film 10 and a surface of the second conductive paste 54 facing the transparent base film 10.

In a third embodiment, referring to FIG. 12, a transparent circuit board 300 differs from the first embodiment as described above, the first connecting pad 42 and the second connecting pad 44 can be omitted, the first conductive paste 52 and the second conductive paste 54 are directly formed on the side of the electrode film 60 facing away from the transparent base film 10 and spaced from each other. The electronic component 70 is electrically connected to the electrode film 60 through the first conductive paste 52 and the second conductive paste 54.

In the method of for manufacturing a transparent PCB 100, since the light can passes through the transparent base film 10 and the electrode film 60, the conductive paste may be melted by the light to fix the electronic component 70, thereby preventing the transparent base film 10 and the electronic component 70 (such as sensor) which are temperature-sensitive from being damaged by high temperature. A sheet resistance of the transparent PCB 100 made by the above methods may be low.

The above is only the preferred embodiment of the present invention, and does not limit the present invention in any form. Although the present invention has been disclosed as the preferred embodiment, it is not intended to limit the present invention. Any person skilled in the art, without departing from the scope of the technical solution of the present invention, when the technical contents disclosed above can be used to make some changes or modifications to equivalent implementations, if without departing from the technical solution content of the present invention, any simple modifications, equivalent changes and modifications made to the above embodiments based on the technical essence of the present invention still fall within the scope of the technical solution of the present invention.

What is claimed is:

1. A method for manufacturing a transparent PCB, comprising:
    providing a transparent base film;
    forming a hardened layer on a side of the transparent base film, wherein the hardened layer is a silicon dioxide coating;
    forming an oxide film on a side of the hardened layer facing away from the transparent base film, the oxide film comprising a first transparent conductive oxide layer, a metal layer, and a second transparent conductive oxide layer stacking orderly, the metal layer sandwiched between the first transparent conductive oxide layer and the second transparent conductive oxide layer, wherein the first transparent conductive oxide layer and the second transparent conductive oxide layer are made of zinc oxide, and the metal layer is made of vanadium;
    etching the oxide film to form an electrode film;
    forming a first conductive paste and a second conductive paste on a side of the electrode film facing away from the transparent base film, the first conductive paste and the second conductive paste spaced from each other; and
    attaching an electronic component to the first conductive paste and the second conductive paste, illuminating and curing the first conductive paste and the second conductive paste to fix the electronic component on the electrode film by the first conductive paste and the second conductive paste.

2. The method for manufacturing the transparent PCB of claim 1, wherein before etching the oxide film to form the electrode film, the method further comprises:
    forming a first connecting pad and a second connecting pad on a side of the oxide film facing away from the transparent base film, the first connecting pad and the second connecting pad spaced from each other;
    the step of "forming a first conductive paste and a second conductive paste on a side of the electrode film facing away from the transparent base film, the first conductive paste and the second conductive paste spaced from each other" comprises:
    forming a first conductive paste on a surface of the first connecting pad facing away from the transparent base film, and forming a second conductive paste on a surface of the second connecting pad facing away from the transparent base film.

3. The method for manufacturing the transparent PCB of claim 2, wherein the step of "forming a first connecting pad and a second connecting pad on a side of the oxide film facing away from the transparent base film, the first connecting pad and the second connecting pad spaced from each other" comprises:
    forming a copper layer on a side of the oxide film facing away from the transparent base film by sputtering or electroplating; and
    etching the copper layer to form a first connecting pad and a second connecting pad, the first connecting pad and the second connecting pad spaced from each other.

4. The method for manufacturing the transparent PCB of claim 3, wherein further comprising:
    forming a covering layer covering a surface of the first conductive paste connecting a surface of the first conductive paste facing away from the transparent base film and a surface of the first conductive paste facing the transparent base film, covering a surface of the second conductive paste connecting a surface of the second conductive paste facing away from the transparent base film and a surface of the second conductive paste facing the transparent base film, covering a surface of the first connecting pad connecting a surface of the first connecting pad facing away from the transparent base film and a surface of the first connecting pad facing the transparent base film, and covering a surface of the second connecting pad connecting a surface of the second connecting pad facing away from the transparent base film and a surface of the second connecting pad facing the transparent base film.

5. The method for manufacturing the transparent PCB of claim 2, wherein a thickness of the first connecting pad and a thickness of the second connecting pad are in a range of 4 μm to 35 μm, respectively.

6. The method for manufacturing the transparent PCB of claim 1, wherein further comprising:
    forming a protective layer on a portion of a surface of the electrode film facing the transparent base film and exposed from the first conductive paste and the second conductive paste.

7. The method for manufacturing the transparent PCB of claim 1, wherein a light transmittance of the transparent base film is in a range of 88% to 95%.

8. The method for manufacturing the transparent PCB of claim 1, wherein a light transmittance of the oxide film is in a range of 82% to 95%.

9. The method for manufacturing the transparent PCB of claim 1, a sheet resistance of the oxide film is in a range of 10 $\Omega/m^2$ to 200 $\Omega/m^2$.

10. The method for manufacturing the transparent PCB of claim 1, a thickness of the oxide film is in a range of 200 nm to 250 nm.

* * * * *